United States Patent [19]

Takahashi

[11] Patent Number: 5,299,093
[45] Date of Patent: Mar. 29, 1994

[54] ELECTRICAL PACKAGING STRUCTURE AND LIQUID CRYSTAL DISPLAY DEVICE HAVING THE SAME

[75] Inventor: Masanori Takahashi, Chigasaki, Japan

[73] Assignee: Canon Kabushiki Kaisha, Tokyo, Japan

[21] Appl. No.: 957,822

[22] Filed: Oct. 8, 1992

[30] Foreign Application Priority Data

Oct. 9, 1991 [JP] Japan .................... 3-289509

[51] Int. Cl.$^5$ ........................... H05K 7/02
[52] U.S. Cl. ........................ 361/760; 361/773; 361/778; 361/807; 174/250; 174/261; 257/786
[58] Field of Search ............ 361/395, 380, 397, 398, 361/400, 406, 409, 410, 408, 417, 720, 733, 736, 748, 749, 760, 761, 773, 778, 776, 807; 174/250, 254, 261; 257/786, 784; 439/55, 67, 68

[56] References Cited

U.S. PATENT DOCUMENTS

| | | | |
|---|---|---|---|
| 3,568,129 | 3/1971 | Gold | 339/17 |
| 3,631,300 | 12/1971 | Humble | 317/122 |
| 3,670,208 | 6/1972 | Hovnanian et al. | 317/101 CM |
| 3,939,381 | 2/1976 | Meany | 317/101 R |
| 4,942,453 | 7/1990 | Ishida et al. | 357/68 |
| 5,121,297 | 6/1992 | Haas | 361/398 |
| 5,124,826 | 6/1992 | Yoshioka et al. | 359/87 |
| 5,140,405 | 8/1992 | King et al. | 357/67 |
| 5,142,449 | 8/1992 | Littlebury et al. | 361/400 |

Primary Examiner—Leo P. Picard
Assistant Examiner—Young Whang
Attorney, Agent, or Firm—Fitzpatrick, Cella, Harper & Scinto

[57] ABSTRACT

An electrical packaging structure has a plurality of semiconductor chips arranged on a substrate and input wirings to the semiconductor chips connected thereto. The input wirings are distributed through a wiring board arranged on the substrate.

11 Claims, 2 Drawing Sheets

ELECTRICAL PACKAGING STRUCTURE AND LIQUID CRYSTAL DISPLAY DEVICE HAVING THE SAME

BACKGROUND OF THE INVENTION

1. Field of the Invention

The present invention relates to an electrical packaging structure and a liquid crystal display device having the structure, and more particularly to a packaging structure of a chip-on-panel for connecting a semiconductor chip and further particularly to an electrical packaging structure suitable for connecting a semiconductor chip to a display substrate of a flat display device such as a liquid crystal display device and a liquid crystal display device having the same.

2. Related Background Art

FIG. 1 shows a packing structure of a chip-on-panel for connecting a semiconductor chip 3 to a display substrate 1 which is a glass substrate of a liquid crystal display device. All input wirings of the semiconductor chip are taken out from a connection port to an external circuit and the connection to an external circuit board is done by a flexible printed circuit board 7 or the like.

In such a structure, where a plurality of semiconductor chips 3 are to be connected, the number of input wirings 4 increases in proportion to the number of semiconductor chips 3, the number of electrode connections of the connecting port of the flexible printed circuit board 2 which electrically connect the input wirings 4 to the external circuit increases, the area required for the connection increases, and the number of wirings of the flexible printed circuit board increases.

As the number of wirings of the flexible printed circuit board increases, the problems arise in that a probability of a defect in the connection of the electrically connected ports (such as a break, a short circuit or an insufficient connection area) increases and yield is lowered, or a probability of a break at the electrically connected point during the use of the device increases and reliability of the device decreases.

The increase of the number of connection points leads to the increase of the manufacturing cost, which frequently affects the compactness of the flexible printed circuit board and the compactness of the device.

SUMMARY OF THE INVENTION

It is an object of the present invention to provide an electrical packaging structure which can reduce the number of electrical connections, reduce the area required for the connection and reduce the number of wirings of the flexible printed circuit board.

It is another object of the present invention to provide an electrical packaging structure which reduces the probability of connection defect such as a break, a short circuit or insufficient strength at the electrically connecting point and improves the reliability of the device.

It is another object of the present invention to provide an electrical packaging structure which reduces the manufacturing cost, reduces the area required for the wiring connection and reduces the size of the entire device.

It is a further object of the present invention to provide a liquid crystal display device having an electrical packaging structure of a chip-on-panel for connecting a plurality of driving semiconductor chips to a display substrate of the liquid crystal display device, which reduces the number of connecting electrodes of the display substrate and the external circuit, reduces the area required for the connection and reduces the number of wirings of the flexible printed circuit board used for the connection of the display substrate and the external circuit.

It is still a further object of the present invention to provide an electrical packaging structure having a plurality of semiconductor chips arranged on a substrate and input wirings connected to the semiconductor chips, in which the input wirings are distributed through a wiring board arranged on the substrate.

It is a further object of the present invention to provide a liquid crystal display device having a packaging structure of a chip-on-panel having a plurality of driving semiconductor chips arranged on the display substrate of the liquid crystal display device, in which the input wirings on the display substrate to the semiconductor chips are distributed through the wiring board arranged on the display substrate.

DETAILED DESCRIPTION OF THE PREFERRED EMBODIMENTS

A preferred embodiment of the present invention is now explained with reference to the drawings.

Figure 1:
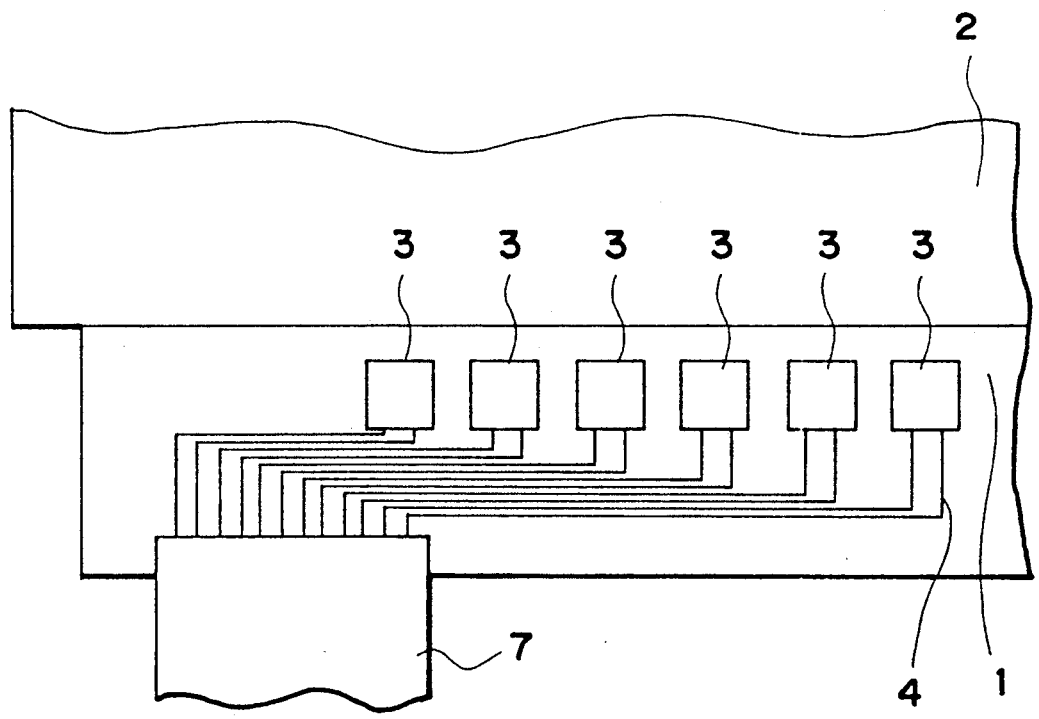
FIG. 1 shows a schematic plan view of a prior art device.
Figure 2:
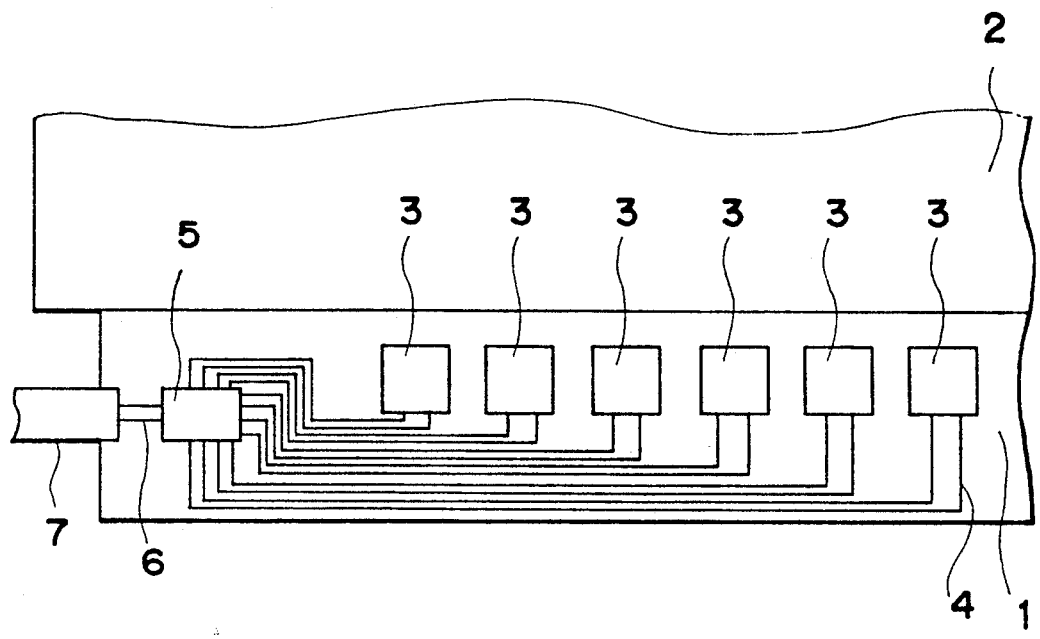
FIG. 2 shows a schematic plan view of a packaging structure in accordance with one preferred embodiment of the present invention.

FIG. 2 shows a schematic plan view of a packaging structure in the present embodiment. In the present embodiment, the packaging structure is applied to a liquid crystal display device which uses a ferro-electric liquid crystal.

In FIG. 2, numerals 1 and 2 denote first and second glass substrates which face each other with a liquid crystal layer (not shown) interposed therebetween. A plurality of semiconductor chips 3 for driving the liquid crystal display device are face-down bonded to the glass substrate 1. Numeral 4 denotes input wirings to the semiconductor chips 3. More wirings are used in an actual liquid crystal display device. Numeral 5 denotes a wiring board having internal wirings for distributing the input wirings to the semiconductor chips 3. It is face-down bonded to the glass substrate 1. The input wirings 4 are wired from the wiring board 5 to the semiconductor chips 3. Numeral 6 denotes output wirings from the wiring board 5. They are distributed to the input wirings 4 through the wiring substrate 5. Numeral 7 denotes a flexible printed circuit board for connecting an external circuit and the liquid crystal display device. They are connected by soldering or an anisotropy conduction bonding film or the like.

In order to solve the above problems, in the packaging structure of the chip-on-panel of the present invention which connects a plurality of driving semiconductor chips to the display substrate of the liquid crystal display device, the input wirings on the display substrate to the semiconductor chips are distributed through the wiring board 5 connected to the display substrate. The wiring board 5 may be a semiconductor chip.

In accordance with the present invention, since the input wirings on the display substrate to the driving semiconductor chips are wired through the wiring board 5 having the internal wiring, the number of connection electrodes of the display substrate and the external circuit is reduced.

In case where the semiconductor chip having the connection electrodes wired by a semiconductor process is used as the wiring board 5, the wiring board may be treated equally to the driving semiconductor chips of the liquid crystal display device.

The wiring board 5 is now explained in detail.

Figure 3:
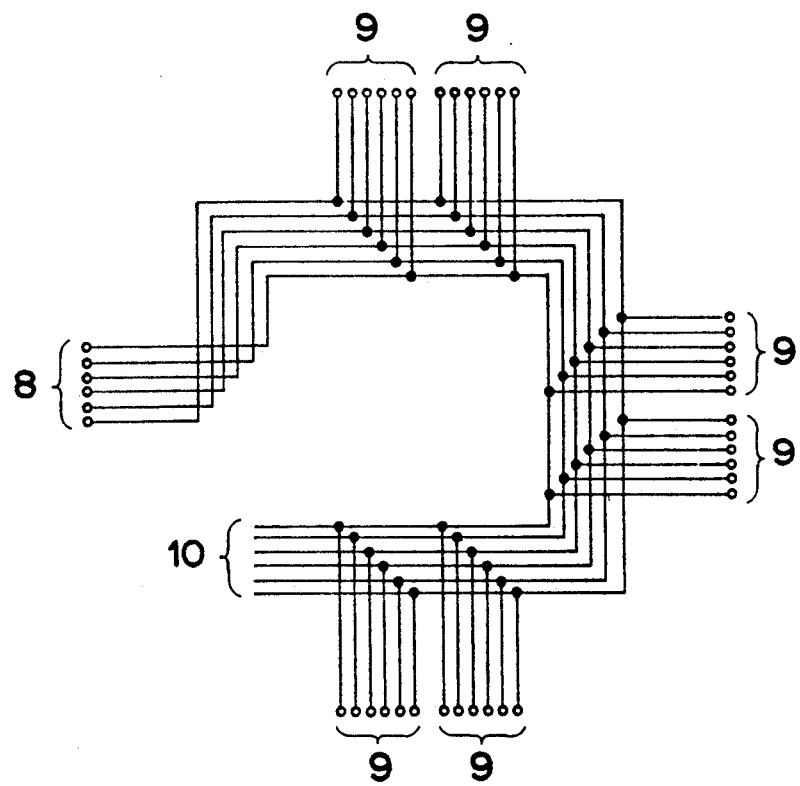
FIG. 3 shows a conceptual view of a wiring board for distributing input wirings to driving semiconductor chips.

FIG. 3 shows a conceptual view of the wiring substrate 5. In FIG. 3, numeral 8 denotes input connection electrodes which are distributed or so-called matrix-connected to connection electrodes 9 through common wirings 10.

In case where the semiconductor chip having the wirings formed by the semiconductor process is used as the wiring board 5, the semiconductor chip may be connected to the glass substrate 1 by the same means as that for connecting the driving semiconductor chips 3 to the glass substrate 1. The only requirement is that the semiconductor chip has an internal wiring structure, and it is not necessary that the connection to the devices in the chip have been made for signal processing purpose.

The wiring board 5 may have wirings on an insulative substrate or on a substrate having an insulative surface, such as a glass substrate with wirings or a ceramic substrate with wirings.

The wiring board may be a planar (two-dimensional matrix) structure or a three-dimensional structure.

The semiconductor chips 3 and the wiring board 5 may be connected to the glass substrate 1 by grounding the connection electrodes on the glass substrate 1, spraying charged conductive fine particles onto the glass substrate 1, depositing the conductive fine particles to the connection electrodes of the glass substrate 1, and connecting the semiconductor chips 3 and the wiring board 5 by an insulative bonding material.

Alternatively, the semiconductor chips 3 and the wiring board 5 may be connected to the glass substrate 1 by face-up bonding the semiconductor chips 3 and the wiring board 5 to the glass substrate 1 and connecting them by wire bonding.

The above objects can be achieved by using the packaging structure of the present invention.

Since the input wirings on the display substrate to the plurality of driving semiconductor chips are wired through the wiring board having the internal wiring, the number of connection electrodes of the display substrate and the external circuit may be reduced, the area required for the connections may be reduced, the number of wirings of the flexible printed circuit board used for the connection of the display substrate and the external circuit may be reduced, and the cost may be reduced.

In case where the semiconductor chip having the connection electrodes wired by the semiconductor process is used as the wiring board, the semiconductor chip as the wiring board may be connected to the glass substrate by the same means as that for connecting the driving semiconductor chips of the liquid crystal display device to the glass substrate.

A highly reliable electrical packaging structure and a liquid crystal display device having the structure are provided by the present invention.

Since better clarity and higher drive speed are required for the liquid crystal display device (particularly that which uses ferro-electric liquid crystal which is suitable for high clarity), there is a trend of increasing of the number of semiconductor chips. The adoption of the electrical packaging structure of the present invention not only contributes to the compactness and high reliability of the device but also significantly contributes to the improvement of image quality.

While the packaging structure of the present invention has been described in connection with the liquid crystal display, it may also be applied to a display device (flat display) other than the liquid crystal display or a read sensor or the like in which a plurality of semiconductor chips are used and the number of connecting wirings is substantial.

The present invention may be modified without departing from the spirit of the present invention.

What is claimed is:

1. An electrical packaging structure, comprising:
   a plurality of semiconductor chips;
   a substrate having said plurality of semiconductor chips arranged thereon;
   input wirings connected to said semiconductor chips; and
   a wiring board arranged on said substrate and receiving said input wirings.

2. The electrical packaging structure according to claim 1, wherein said wiring board is a semiconductor chip.

3. The electrical packaging structure according to claim 1, wherein said wiring board has wirings formed on one of either an insulated substrate and a substrate having an insulated surface.

4. The electrical packaging structure according to claim 1, wherein said wiring board is electrically connected to said substrate by bonding material having one of either conductive particles and wire-bonding.

5. The electrical packaging structure according to claim 1, further comprising output wires connecting said wiring board with a printed circuit board.

6. The liquid crystal display device having a packaging structure of a chip-on-panel, comprising:
   a plurality of driving semiconductor chips;
   a display substrate of the liquid crystal display device having said plurality of semiconductor chips arranged thereon;
   input wirings disposed on said display substrate and connected to said semiconductor chips; and
   a wiring board arranged on said display substrate and receiving said input wirings.

7. The liquid crystal display device according to claim 6, wherein said wiring board is a semiconductor chip.

8. The liquid crystal display device according to claim 6, wherein the liquid crystal display device uses a ferro-electric liquid crystal.

9. The liquid crystal display device according to claim 6, wherein said wiring board has wirings formed on one of either an insulated substrate and a substrate having an insulated surface.

10. The liquid crystal display device according to claim 6, wherein said wiring board is electrically connected to said substrate by bonding material having one of either conductive particles and wire-bonding.

11. The liquid crystal display device according to claim 6, further comprising output wires connecting said wiring board with a printed circuit board.

* * * * *